United States Patent
Lee et al.

(10) Patent No.: US 9,577,208 B2
(45) Date of Patent: Feb. 21, 2017

(54) ORGANIC LIGHT EMITTING DIODE DISPLAY

(71) Applicant: Samsung Display Co., Ltd., Yongin, Gyeonggi-Do (KR)

(72) Inventors: Seung-Kyu Lee, Asan-si (KR); Chae Han Hyun, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/709,373

(22) Filed: May 11, 2015

(65) Prior Publication Data

US 2016/0155983 A1    Jun. 2, 2016

(30) Foreign Application Priority Data

Dec. 1, 2014  (KR) .................. 10-2014-0169851

(51) Int. Cl.
*H01L 51/52* (2006.01)
*H01L 27/32* (2006.01)

(52) U.S. Cl.
CPC ....... *H01L 51/5209* (2013.01); *H01L 27/3216* (2013.01); *H01L 27/3218* (2013.01); *H01L 51/5268* (2013.01)

(58) Field of Classification Search
CPC ............ H01L 51/5209; H01L 51/5268; H01L 27/3218; H01L 27/3216
See application file for complete search history.

(56) References Cited

U.S. PATENT DOCUMENTS

2008/0116791 A1\* 5/2008 Kim .................... H01L 27/3244
313/504

FOREIGN PATENT DOCUMENTS

| JP | 4277562 B2 | 3/2009 |
|---|---|---|
| KR | 10-0742374 B1 | 7/2007 |
| KR | 10-0752378 B1 | 8/2007 |
| KR | 10-0813004 B1 | 3/2008 |
| KR | 10-2011-0015757 A | 2/2011 |

\* cited by examiner

*Primary Examiner* — Kyoung Lee
(74) *Attorney, Agent, or Firm* — Knobbe Martens Olson & Bear LLP

(57) ABSTRACT

An organic light emitting diode (OLED) display is disclosed. In one aspect, the OLED display includes a substrate, a plurality of transistors formed over the substrate and a passivation layer covering the transistors. The OLED display also includes an OLED formed over the passivation layer and including a pixel electrode, an organic emission layer, and a common electrode. The pixel electrode includes a first curved portion that does not overlap the organic emission layer in the depth dimension of the OLED display.

19 Claims, 9 Drawing Sheets

ORGANIC LIGHT EMITTING DIODE DISPLAY

RELATED APPLICATIONS

This application claims priority to and the benefit of Korean Patent Application No. 10-2014-0169851 filed in the Korean Intellectual Property Office on Dec. 1, 2014, the entire contents of which are incorporated herein by reference.

BACKGROUND

Field

The described technology generally relates to an organic light emitting diode display.

Description of the Related Technology

An organic light emitting diode (OLED) display includes a matrix of OLEDs each configured by a hole injection electrode, an organic emission layer, and an electron injection electrode. An electron and a hole are coupled with each other in the organic emission layer to generate an exciton, and light is emitted by energy generated when the exciton falls from an excited state to a ground state. OLED technology displays a predetermined image by careful control of the emitted light.

One of the hole injection electrode and the electron injection electrode becomes a pixel electrode, and the other electrode becomes a common electrode. The pixel electrode and the organic emission layer are provided for each sub-pixel (a pixel includes multiple colors subpixels), and the pixel electrode is electrically connected with a thin film transistor of the corresponding subpixel. The common electrode is formed over the display area. The pixel may include a red subpixel, a green subpixel, and a blue subpixel, and further include a white subpixel.

SUMMARY OF CERTAIN INVENTIVE ASPECTS

One inventive aspect relates to an OLED display for enhanced visibility outdoors.

Another aspect is an OLED display capable of increasing outside visibility and a contrast ratio of a screen by minimizing reflection of external light by a metal reflective film such as a pixel electrode.

Another aspect is an OLED display including: a substrate; a plurality of transistors Banned on the substrate; a passivation layer covering the transistors; and an OLED formed on the passivation layer and including a pixel electrode, an organic emission layer, and a common electrode. The pixel electrode may include a first curved portion positioned in a region which does not overlap with the organic emission layer.

The pixel electrode may include a metal reflective film, and the common electrode may include any one of a transparent conductive film and a translucent conductive film. The OLED display may further include an initialization voltage line formed on the passivation layer with the same material as the pixel electrode, in which the initialization voltage line may include a second curved portion.

The first curved portion and the second curved portion may be formed concavely toward the common electrode. The surface of the passivation layer may include a plurality of concave portions, and the first curved portion and the second curved portion may be formed on the concave portions with predetermined thicknesses.

On the other hand, the first curved portion and the second curved portion may be formed convexly toward the common electrode. The surface of the passivation layer may include a plurality of convex portions, and the first curved portion and the second curved portion may be formed on the convex portions with predetermined thicknesses.

The second curved portion may be formed at the remaining portion except for the portion overlapping with the contact hole of the initialization voltage line.

The curved portions formed on the pixel electrode and the initialization voltage line scatter external light to minimize reflection of the external light. According to the OLED display of the exemplary embodiment, it is possible to improve a contrast ratio of a screen and outside visibility by minimizing the reflection of the external light.

Another aspect is an organic light emitting diode (OLED) display, comprising: a substrate; a plurality of transistors formed over the substrate; a passivation layer covering the transistors; and an OLED formed over the passivation layer and including a pixel electrode, an organic emission layer, and a common electrode, wherein the pixel electrode includes a first curved portion that does not overlap the organic emission layer in the direction of light emission.

In the above display, the pixel electrode includes a metal reflective film, and wherein the common electrode includes at least one of a transparent conductive film and a translucent conductive film. The above display further comprises: an initialization voltage line formed over the passivation layer and formed of the same material as the pixel electrode, wherein the initialization voltage line includes a second curved portion.

In the above display, the first and second curved portions have substantially the same shape. In the above display, the first and second curved portions have substantially the same size. In the above display, the first and second curved portions do not directly contact each other. In the above display, neither of the first and second curved portions is formed directly above the transistors. In the above display, the first and second curved portions are concave toward the common electrode. In the above display, the surface of the passivation layer includes a plurality of concave portions, and wherein the first and second curved portions are formed over the concave portions with predetermined thicknesses. In the above display, the first and second curved portions are convex toward the common electrode.

In the above display, the surface of the passivation layer includes a plurality of convex portions, and wherein the first and second curved portions are formed over the convex portions with predetermined thicknesses. In the above display, the second curved portion is formed at the remaining portion except for the portion overlapping the contact hole of the initialization voltage line. In the above display, the first curved portion is not formed directly below the organic emission layer. In the above display, each of the transistors includes source and drain electrodes, wherein the pixel electrode includes a non-linear portion that contacts one of the source and drain electrodes, and wherein the height of the first curved portion is similar to that of the non-linear portion. In the above display, the passivation layer has a groove or protrusion on which the first curved portion is formed.

Another aspect is an organic light emitting diode (OLED) display, comprising: a substrate; a plurality of transistors formed over the substrate; a passivation layer covering the transistors; and a plurality of OLEDs formed over the passivation layer, wherein each of the OLEDs includes a pixel electrode, an organic emission layer, and a common electrode, wherein the pixel electrode includes at least one first curved portion that is convex or concave with respect to the common electrode, and wherein the first curved portion is formed between adjacent organic emission layers.

In the above display, the first curved portion does not overlap the organic emission layer in the depth dimension of the OLED display. The above display further comprises an initialization voltage line formed over the passivation layer, wherein the initialization voltage line includes at least one second curved portion that is convex or concave with respect to the common electrode. In the above display, the passivation layer has a groove or protrusion on which the first curved portion is formed. In the above display, the first curved portion is not formed directly above any of the transistors.

DETAILED DESCRIPTION OF CERTAIN INVENTIVE EMBODIMENTS

Figure 1:
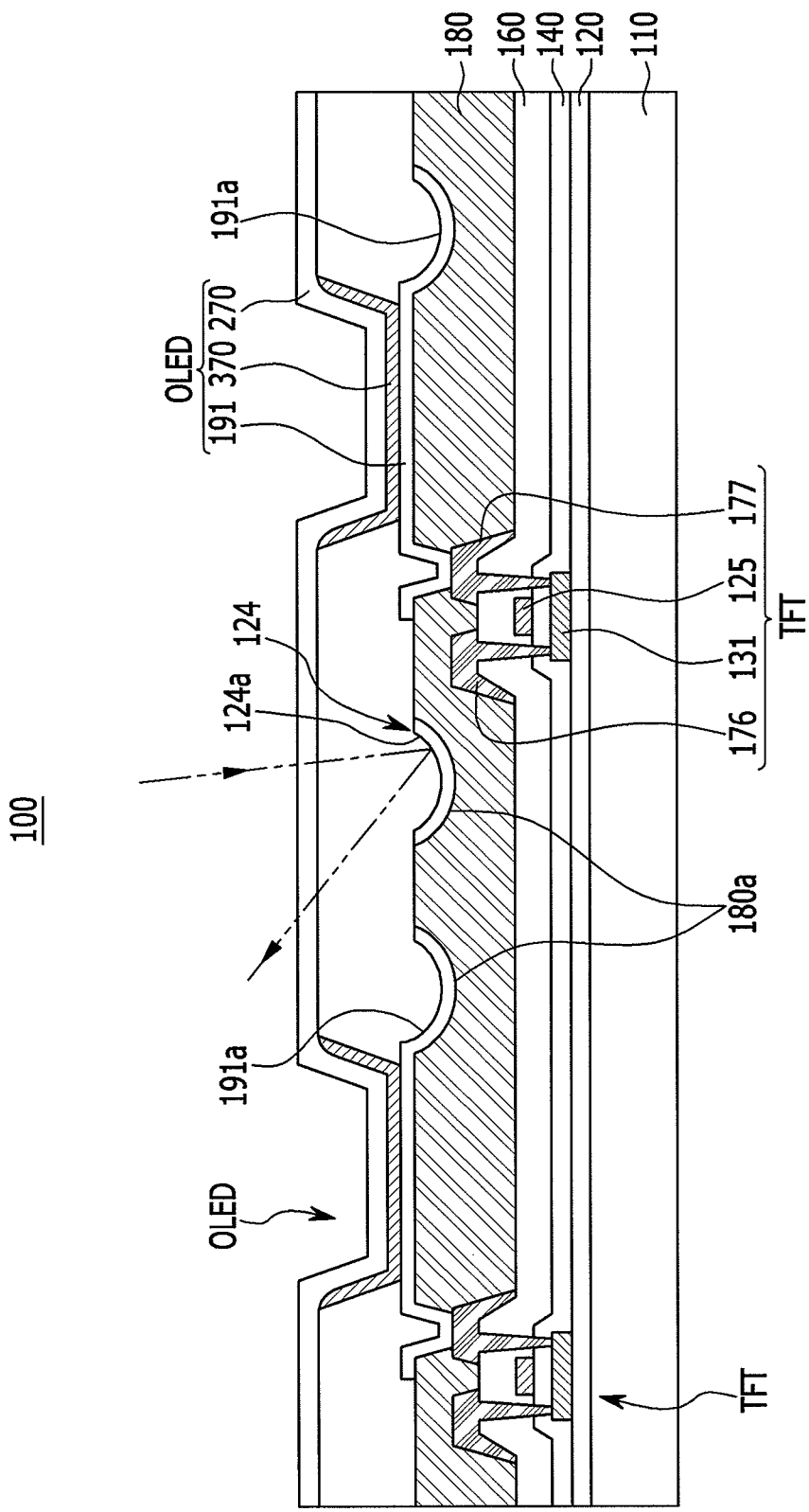
FIG. 1 is a partially enlarged cross-sectional view of an OLED display according to an exemplary embodiment.

For a front emission type OLED display, the pixel electrode is formed as a metal reflective layer and the common electrode is formed as a transparent conductive film or a translucent conductive film. Light emitted from the organic emission layer is reflected from the pixel electrode and passes though the common electrode to be displayed. However, when the OLED display is observed from the environment, external light is reflected by the pixel electrode to decrease a contrast ratio of a screen and outside visibility.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In addition, the size and thickness of each configuration shown in the drawings may be arbitrarily shown for understanding and ease of description, but the present disclosure is not limited thereto. In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a partially enlarged cross-sectional view of an OLED display according to an exemplary embodiment.

Referring to FIG. 1, an OLED display 100 includes a substrate 110, a thin film transistor TFT formed on the substrate 110, a passivation layer 180 covering the thin film transistor TFT, and an OLED formed on the passivation layer 180.

The substrate 110 can be a rigid substrate such as glass, quartz, and metal, or a flexible substrate such as a plastic film. In the case of the flexible substrate, the substrate 110 may be made of polymer materials having excellent heat resistance and durability such as polyimide and polycarbonate.

A buffer layer 120 may be formed on the substrate 110. The buffer layer 120 serves to prevent an impurity from penetrating through the substrate 110 and provide a flat surface to the top of the substrate 110. The buffer layer 120 may include an inorganic material such as $SiO_2$ and SiNx or an organic material such as polyimide, polyester, and acryl.

The thin film transistor TFT is formed on the buffer layer 120. The thin film transistor TFT includes a semiconductor layer 131, a gate electrode 125, a source electrode 176, and a drain electrode 177. The semiconductor layer 131 may be made of polysilicon or oxide semiconductors, and in the case of the oxide semiconductor, a separated passivation layer may be added onto the semiconductor layer 131. The semiconductor layer 131 includes a channel region, and a source region and a drain region which are positioned at both sides of the channel region and doped with impurities.

A gate insulating layer 140 is formed on the semiconductor layer 131. The gate insulating layer 140 is to insulate the semiconductor layer 131 and the gate electrode 125 from each other and may include an inorganic material such as $SiO_2$ and SiNx or an organic material. The gate electrode 125 is formed on the gate insulating layer 140. The gate electrode 125 at least partially overlaps the channel region of the semiconductor layer 131 and may include Au, Ag, Cu, Ni, Pt, Pd, Al, Mo, or the like.

An interlayer insulating layer 160 is formed on the gate electrode 125. The interlayer insulating layers 160 are disposed between the gate electrode 125 and the source electrode 176 and between the gate electrode 125 and the drain electrode 177 to insulate them from each other. The interlayer insulating layer 160 can include an inorganic material such as $SiO_2$ and SiNx and may have a double-layer structure of a $SiO_2$ layer and a SiNx layer.

The source electrode 176 and, the drain electrode 177 are formed on the interlayer insulating layer 160. In this case, contact holes are formed in the interlayer insulating layer 160 and the gate insulating layer 140 to expose the source region and the drain region of the semiconductor layer 131, and through the contact holes, the source electrode 176 contacts the source region and the drain electrode 177 contacts the drain region.

In FIG. 1, a top gate type thin film transistor TFT is illustrated as an example, but a structure of the thin film transistor TFT is not limited to the illustrated example. The thin film transistor TFT is covered and protected by the passivation layer 180 and electrically connected to the OLED to drive the OLED.

The passivation layer 180 is formed by an inorganic insulating layer or an organic insulating layer, or may be formed by a laminated structure of the inorganic insulating layer and the organic insulating layer. The inorganic insulating layer may include $SiO_2$, SiNx, $Al_2O_3$, $TiO_2$, $Ta_2O_5$, $HfO_2$, $ZrO_2$, or the like, and the organic insulating layer may include polymethylmetacrylate (PMMA), polystyrene (PS), an acryl-based polymer, an imide-based polymer, an aryle-ther-based polymer, or the like.

The OLED is formed on the passivation layer 180, and includes a pixel electrode 191, an organic emission layer 370, and a common electrode 270. One pixel electrode 191 is provided for each pixel and contacts the drain electrode 177 through the contact hole formed in the passivation layer 180. The common electrode 270 can be formed on the entire display area. The organic emission layer 370 includes a light emission layer, and may include at least one of a hole injection layer, a hole transport layer, an electron transport layer, and an electron injection layer.

One of the pixel electrode 191 and the common electrode 270 serves as an anode injecting a hole to the organic emission layer 370, and the other electrode serves as a cathode injecting an electron. The hole and the electron are coupled with each other in the organic emission layer 370 to generate an exciton, and light is emitted by energy generated when the exciton falls from an excited state to a ground state.

When the OLED display 100 is a front emission type, the pixel electrode 191 is formed as a metal reflective film, and the common electrode 270 is formed as a transparent conductive film or a translucent conductive film. The light emitted from the organic emission layer 370 is reflected from the pixel electrode 191 and passes through the common electrode 270 to be emitted to the outside.

The metal reflective film may include Au, Ag, Mg, Al, Pt, Pd, Ni, Nd, Ir, Cr, or the like. The transparent conductive film may include indium tin oxide (ITO), indium zinc oxide (IZO), ZnO, $In_2O_3$, or the like. The translucent conductive film may be formed as a metal thin film including Li, Ca, LiF/Ca, LiF/Al, Al, Ag, Mg, or the like, and a transparent film such as ITO, IZO, ZnO, $In_2O_3$ may be laminated on the translucent conductive film.

A capping layer (not illustrated) may be formed on the common electrode 270. The capping layer serves to protect the OLED and optimize light efficiency through refractive index matching in the case of the front emission type. The capping layer may include an organic material such as α-NPD, NPB, TPD, m-MTDATA, Alq3, or CuPc.

A blocking film (not illustrated) may be formed on the capping layer. The blocking layer may include an inorganic material such as LiF, $MgF_2$, $CaF_2$, or the like and prevent the OLED from being damaged by plasma used in a process of forming an inorganic film of thin film encapsulation. Further, the blocking layer may have a function of optimizing light efficiency by matching a refractive index in the case of the front emission type, like the capping layer.

An encapsulation part (not illustrated) sealing the OLED is formed on the blocking layer. The encapsulation part may be configured by a thin film encapsulation including at least a first inorganic film, a first organic film, and a second inorganic film. Since the OLED easily deteriorates by environmental moisture or oxygen, the thin film encapsulation seals the OLED to block contact with ambient conditions.

Meanwhile, the OLED display 100 may further include an initialization voltage line 124 transferring an initialization voltage. The initialization voltage line 124 may be formed of a material (metal reflective film) such as the pixel electrode 191 on the passivation layer 180.

In the first exemplary embodiment, the pixel electrode 191 includes a first curved portion 191a positioned in a region which does not overlap or is not formed directly below the organic emission layer 370. The first curved portion 191a may be an edge region of the pixel electrode 191 surrounding the organic emission layer 370. In addition, the initialization voltage line 124 includes a second curved portion 124a. Here, the first curved portion 191a and the second curved portion 124a have curved shapes observed from the cross section and may be formed concavely toward the common electrode 270. Each of the first and second curved portions 191a and 124a can be non-linear. The first and second curved portions 191a and 124a can have substantially the same shape and/or the same size. The height of each of the first and second curved portions 191a and 124a can be substantially the same or similar to that of the non-linear portion of the pixel electrode 191 that contacts the drain electrode 177 (see, e.g., FIG. 1). The height of each of the first and second curved portions 191a and 124a can be similar to or less than about half the height of the passivation layer 180. The first and second curved portions 191a and 124a may not directly contact each other. Two or more first curved portions can be formed in the pixel electrode 191. Furthermore, two or more second curved portions can be formed in the initialization voltage line 124.

The surface of the passivation layer 180 is patterned to form a plurality of concave portions 180a in a region where the edge of the pixel electrode 191 and the initialization voltage line 124 are to be positioned. In addition, the first curved portion 191a of the pixel electrode 191 and the second curved portion 124a of the initialization voltage line 124 may be formed on the concave portions 180a with predetermined thicknesses.

The first curved portion 191a of the pixel electrode 191 and the second curved portion 124a of the initialization voltage line 124 do not directly reflect light (external light) incident from the environment but scatter the light to minimize reflection of external light. Accordingly, the OLED display 100 of the first exemplary embodiment may increase a contrast ratio and outside visibility.

Figure 2:
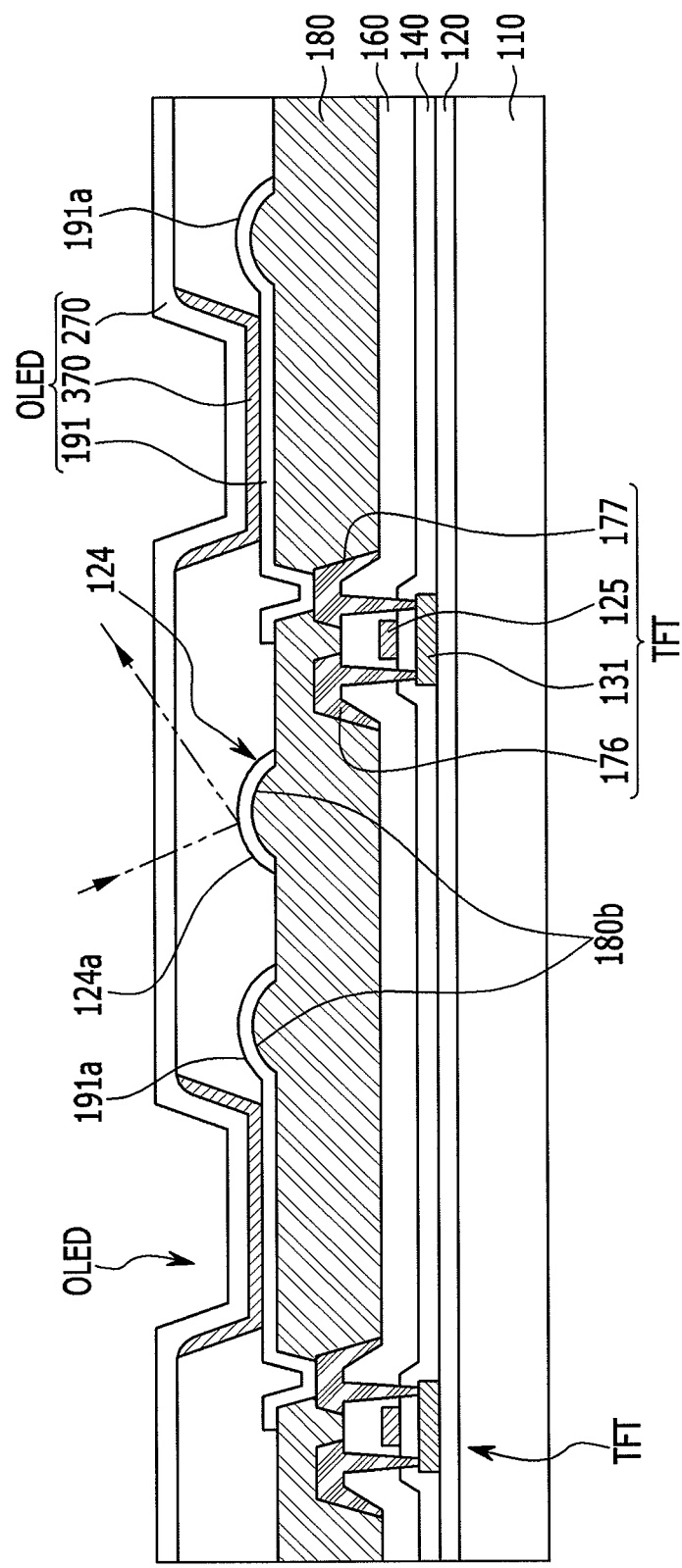
FIG. 2 is a partially enlarged cross-sectional view of an OLED display according to another exemplary embodiment.

FIG. 2 is a partially enlarged cross-sectional view of an OLED display according to another exemplary embodiment.

Referring to FIG. 2, an OLED display 101 is formed by the same configuration as the first exemplary embodiment described above, except that the first curved portion 191a of the pixel electrode 191 and the second curved portion 124a of the initialization voltage line 124 are formed convexly toward the common electrode 270. The same members as the first exemplary embodiment use like reference numerals, and the duplicated description is omitted.

The surface of the passivation layer 180 is patterned to form a plurality of convex portions 180b in a region where the edge of the pixel electrode 191 and the initialization voltage line 124 are to be positioned. In addition, the first curved portion 191a of the pixel electrode 191 and the second curved portion 124a of the initialization voltage line 124 may be formed on the convex portions 180b with predetermined thicknesses.

The first curved portion 191a of the pixel electrode 191 and the second curved portion 124a of the initialization voltage line 124 do not directly reflect light (external light) incident from the environment but scatter the light to minimize reflection of external light. Accordingly, the OLED display 101 of the second exemplary embodiment may also increase contrast ratio and outdoor usage.

The OLED displays 100 and 101 of the first and second exemplary embodiments may include pentile matrix type pixel structures, and rendering driving in which colors are expressed by sharing adjacent pixels may be applied. The OLED displays 100 and 101 may implement a high resolution with a small number of pixels. Next, the pentile matrix type pixel structure will be described in detail.

Figure 3:
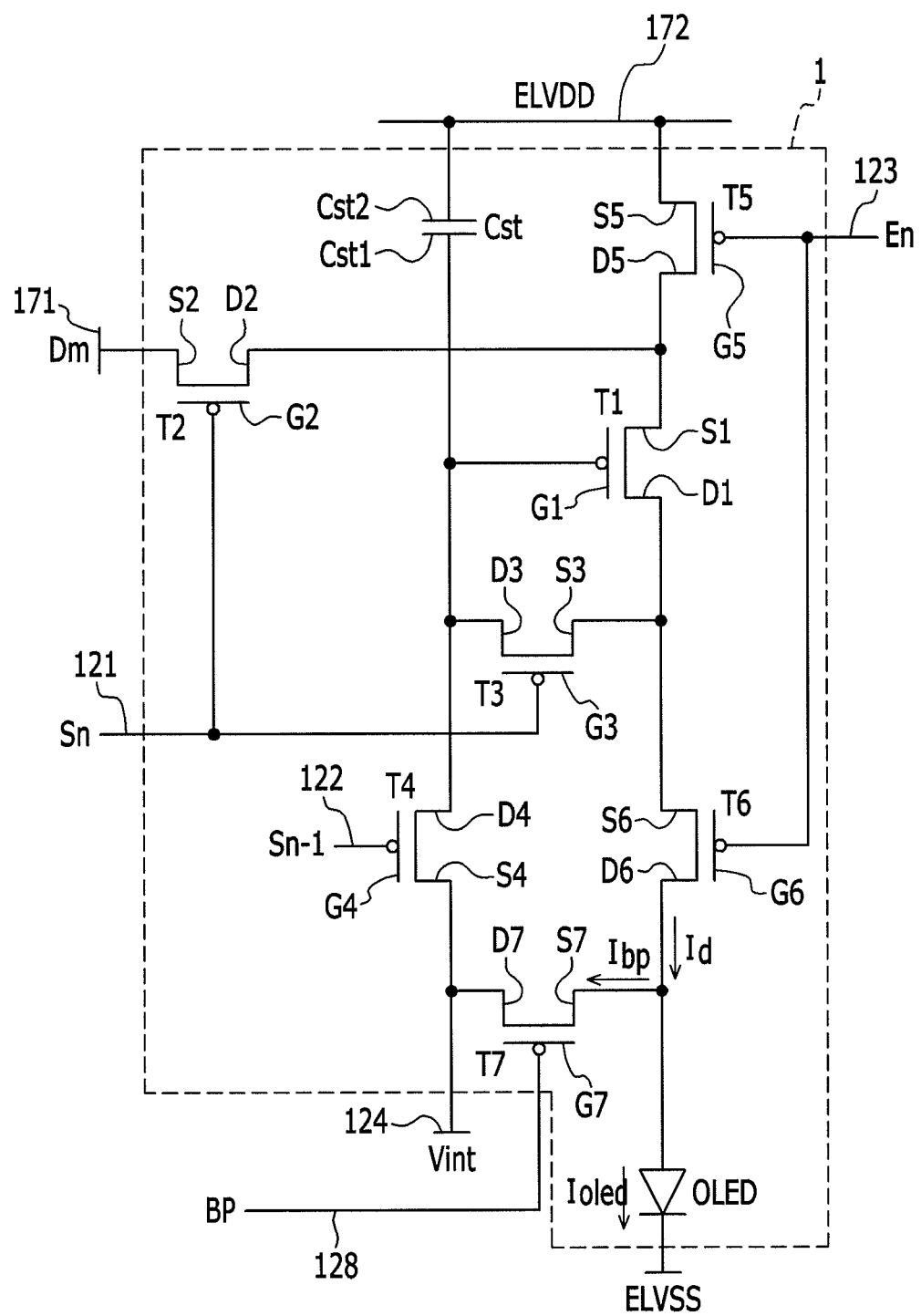
FIG. 3 is an equivalent circuit diagram of one pixel of the OLED display according to the exemplary embodiment.

FIG. 3 is an equivalent circuit diagram of one pixel of the OLED display according to the exemplary embodiment.

Referring to FIG. 3, a pixel 1 of the OLED display includes a plurality of signal lines 121, 122, 123, 124, 128, 171, and 172, a plurality of transistors T1, T2, T3, T4, T5, T6, and T7 connected to the signal lines, a storage capacitor Cst, and an OLED.

The transistors may include a driving transistor T1, a switching transistor T2, a compensation transistor T3, an initialization transistor T4, an operation control transistor T5, a light emission control transistor T6, and a bypass transistor T7. The signal lines may include a scan line 121, a previous scan line 122, a light emission control line 123, an initialization voltage line 124, a bypass control line 128, a data line 171, and a driving voltage line 172.

The scan line 121 transfers a scan signal Sn, and the previous scan line 122 transfers a previous scan signal Sn−1 to the initialization transistor T4. The light emission control line 123 transfers a light emission control signal En to the operation control transistor T5 and the light emission control transistor T6. The initialization voltage line 124 transfers an initialization voltage Vint initializing the driving transistor T1, and the bypass control line 128 transfers a bypass signal BP to the bypass transistor T7. The data line 171 crosses the scan line 121 and transfers a data signal Dm. The driving voltage line 172 is formed substantially in parallel with the data line 171 and transfers a driving voltage ELVDD.

A gate electrode G1 of the driving transistor T1 is connected with one end Cst1 of the storage capacitor Cst, and the source electrode S1 of the driving transistor T1 is connected with the driving voltage line 172 via the operation control transistor T5. The drain electrode D1 of the driving transistor T1 is electrically connected with an anode of the OLED via the light emission control transistor T6. The driving transistor T1 receives the data signal Dm according to a switching operation of the switching transistor T2 to supply a driving current Id to the OLED.

A gate electrode G2 of the switching transistor T2 is connected with the scan line 121 and a source electrode S2 of the switching transistor T2 is connected with the data line 171. A drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the scan line 121 to perform a switching operation of transferring the data signal Dm transferred to the data line 171 to the source electrode S1 of the driving transistor T1.

A gate electrode G3 of the compensation transistor T3 is directly connected with the scan line 121. A source electrode S3 of the compensation transistor T3 is connected with the drain electrode D1 of the driving transistor T1 and connected with the anode of the OLED via the light emission control transistor T6. A drain electrode D3 of the compensation transistor T3 is connected to one end Cst1 of the storage capacitor Cst, a drain electrode D4 of the initialization transistor T4, and the gate electrode G1 of the driving transistor T1. The compensation transistor T3 is turned on according to the scan signal Sn received through the scan line 121 and connects the gate electrode G1 and the drain electrode D1 of the driving transistor T1 to diode-connect the driving transistor T1.

A gate electrode G4 of the initialization transistor T4 is connected with the previous scan line 122 and a source electrode S4 of the initialization transistor T4 is connected with the initialization voltage line 124. A drain electrode D4 of the initialization transistor T4 is connected to one end Cst1 of the storage capacitor Cst, a drain electrode D3 of the compensation transistor T3, and the gate electrode G1 of the driving transistor T1. The initialization transistor T4 is turned on according to the previous scan signal Sn−1 received through the previous scan line 122 and transfers the initialization voltage Vint to the gate electrode G1 of the driving transistor T1 to perform an initialization operation of initializing a voltage of the gate electrode G1 of the driving transistor T1.

A gate electrode G5 of the operation control transistor T5 is connected with the light emission control line 123, and a source electrode S5 of the operation control transistor T5 is connected to the driving voltage line 172. A drain electrode D5 of the operation control transistor T5 is connected to the source electrode S1 of the driving transistor T1 and the drain electrode D2 of the switching transistor T2.

A gate electrode G6 of the light emission control transistor T6 is connected with the light emission control line 123, a source electrode S6 of the light emission control transistor T6 is connected with the drain electrode D1 of the driving transistor T1 and the source electrode S3 of the compensation transistor T3. A drain electrode D6 of the light emission control transistor T6 is electrically connected with the anode of the OLED. The operation control transistor T5 and the light emission control transistor T6 are simultaneously turned on according to the light emission control signal En received through the light emission control line 123, the driving voltage ELVDD is transferred to the OLED, and then a light emission current Ioled flows in the OLED.

A gate electrode G7 of the bypass transistor T7 is connected with the bypass control line 128, and a source electrode S7 of the bypass transistor T7 is connected with the drain electrode D6 of the light emission control transistor T6 and the anode of the OLED. A drain electrode D7 of the bypass transistor T7 is connected with the initialization voltage line 124 and the source electrode S4 of the initialization transistor T4.

The other end Cst2 of the storage capacitor Cst is connected with the driving voltage line 172, and a cathode of the OLED is connected with the common voltage ELVSS. The OLED receives the light emission current Ioled from the driving transistor T1 to emit light.

Next, an operation process of one pixel will be described.

First, for an initializing period, the previous scan signal Sn−1 having a low level is supplied through the previous scan line 122. Then, the initialization transistor T4 is turned on in response to the previous scan signal Sn−1 having the low level, the initialization voltage Vint is transferred from the initialization voltage line 124 to the gate electrode G1 of the driving transistor T1 through the initialization transistor T4, and the driving transistor T1 is initialized by the initialization voltage Vint.

Thereafter, for a data programming period, the scan signal Sn having the low level is supplied through the scan line 121. Then, the switching transistor T2 and the compensation transistor T3 are turned on in response to the scan signal Sn having the low level. In this case, the driving transistor T1 is diode-connected by the turned-on compensation transistor T3 and biased in a forward direction. Then, a compensation voltage Dm+Vth (Vth has a negative (−) value) reduced from the data signal Dm supplied from the data line 171 by a threshold voltage Vth of the driving transistor T1 is applied to the gate electrode G1 of the driving transistor T1.

The driving voltage ELVDD and the compensation voltage Dm+Vth are applied to both ends of the storage capacitor Cst, and a charge corresponding to a voltage difference between both ends is stored in the storage capacitor Cst. Thereafter, for a light emission period, the light emission control signal En supplied from the light emission control line 123 is changed from a high level to a low level. Then, for the light emission period, the operation control transistor T5 and the light emission control transistor T6 are turned on by the light emission control signal En of the low level.

Then, a driving current Id is generated in substantial proportion to a voltage difference between the voltage of the gate electrode G1 of the driving transistor T1 and the driving voltage ELVDD, and the driving current Id is supplied to the OLED through the light emission control transistor T6. For the light emission period, a gate-source voltage Vgs of the driving transistor T1 is maintained as '(Dm+Vth)−ELVDD' by the storage capacitor Cst. According to a current-voltage relationship of the driving transistor T1, the driving current Id is proportional to '(Dm−ELVDD)$^2$' which is a square of a value obtained by subtracting the threshold voltage Vth from the gate-source voltage Vgs. Accordingly, the driving current 1$d$ is determined regardless of the threshold voltage Vth of the driving transistor T1.

In this case, the bypass transistor T7 receives the bypass signal BP from the bypass control line 128. The bypass signal BP is a predetermined level of voltage which may always turn off the bypass transistor T7. As the gate electrode G7 of the bypass transistor T7 receives the voltage at the transistor off level, the bypass transistor T7 can be always turned off and a part of the driving current Id can be removed as the bypass current Ibp through the bypass transistor T7 in the off state.

Accordingly, when the driving current displaying a black image flows, the light emission current holed of the OLED is reduced by a current amount of the bypass current Ibp removed from the driving current Id through the bypass transistor T7 to become a minimum current amount as a level which may accurately express the black image. Therefore, a black luminance image is exactly implemented by using the bypass transistor T7 to improve a contrast ratio of the screen.

Next, a layout structure of a plurality of pixels will be described.

Figure 4:
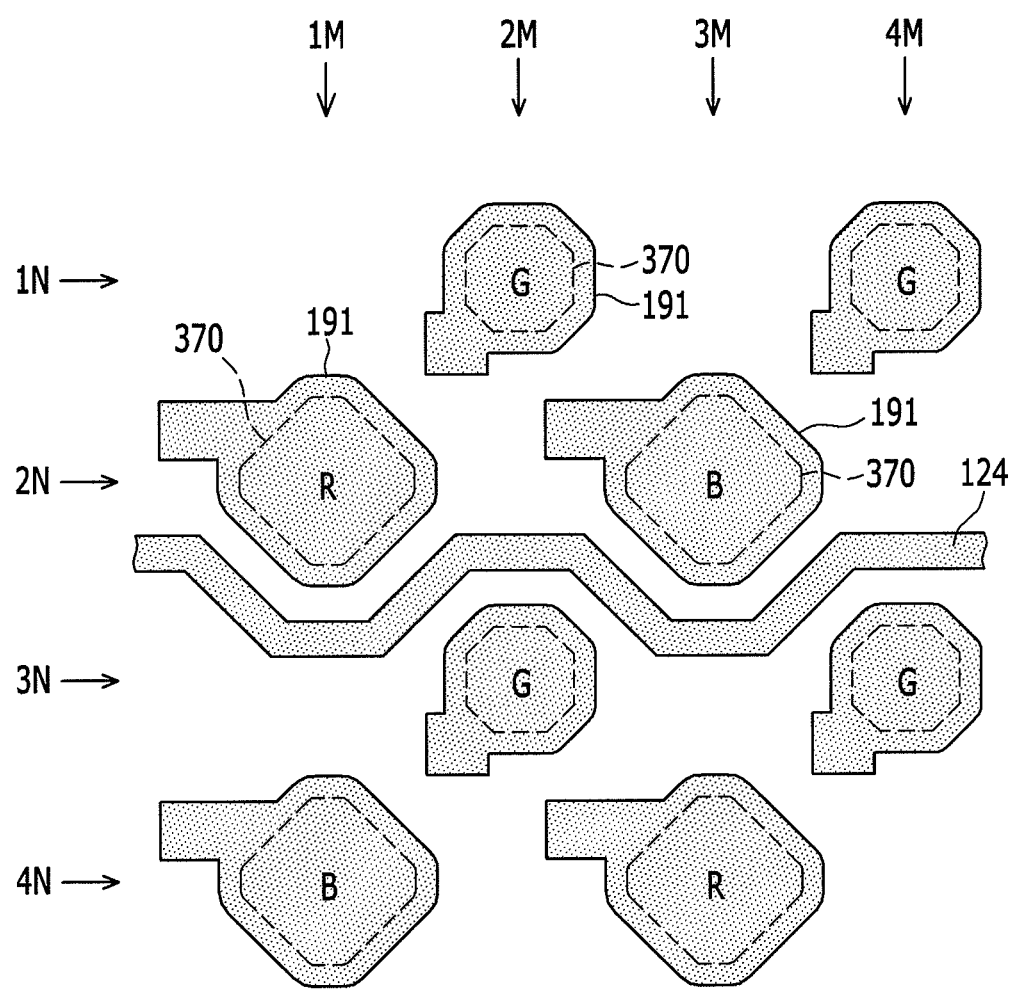
FIG. 4 is a schematic layout view of a plurality of pixels of the organic light emitting display according to the exemplary embodiment.

FIG. 4 is a schematic layout view of a plurality of pixels of the OLED display according to the exemplary embodiment.

Referring to FIG. 4, a plurality of green pixels G is disposed at intervals therebetween in a first row 1N, and red pixels R and blue pixels B are alternately disposed in a second row 2N. The green pixels G is disposed at intervals therebetween in a third row 3N, and the blue pixels B and the red pixels R are alternately disposed in a fourth row 4N. The layout of the pixels is repeated up to an N-th row.

The green pixels G disposed in the first row 1N and the red pixels R and the blue pixels B in the second row 2N are alternately positioned. Accordingly, in a first column 1M, red pixels R and blue pixels B are alternately disposed, and in a second column 2M, a plurality of green pixels G is disposed at intervals therebetween. In a third column 3M, blue pixels B and red pixels R are alternately disposed, and in a fourth column 4M, a plurality of green pixels G is disposed at intervals therebetween. The layout of the pixels is repeated up to an M-th column.

Next, a detailed structure of the pixels illustrated in FIG. 3 will be described.

Figure 5:
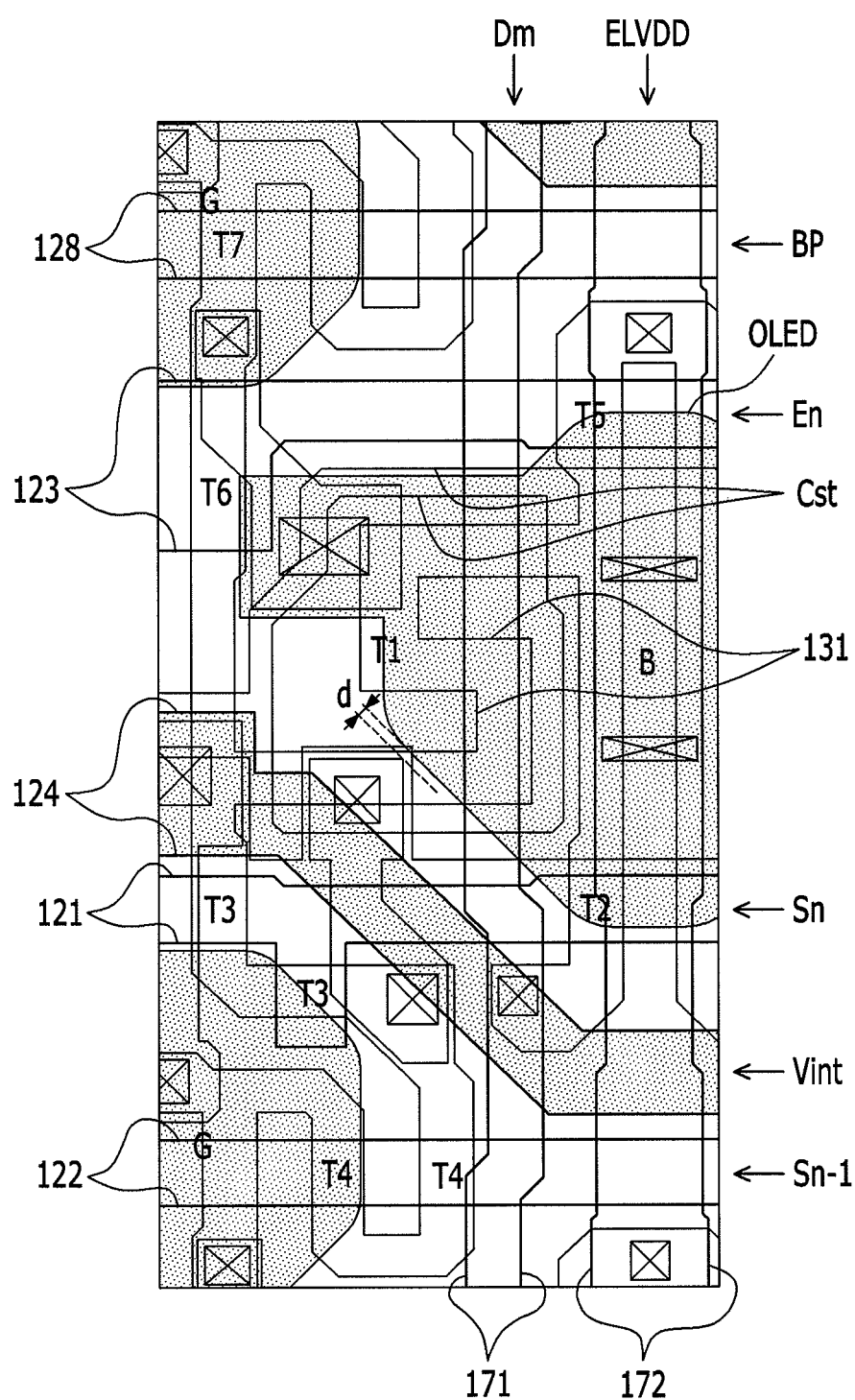
FIG. 5 is a schematic plan view illustrating a plurality of transistors and a plurality of signal lines of the organic light emitting display according to the exemplary embodiment.

FIG. 5 is a schematic plan view illustrating a plurality of transistors and a plurality of signal lines of the OLED display according to the exemplary embodiment.

Referring to FIG. 5, the scan line 121 applying the scan signal Sn, the previous scan line 122 applying the previous scan signal Sn−1, the light emission control line 123 applying the light emission control signal En, and the bypass control line 128 applying the bypass signal BP may be formed in parallel to a row direction. The data line 171 applying the data signal Dm and the driving voltage line 172 applying the driving voltage ELVDD may be formed in parallel with a column direction. The initialization voltage line 124 applying the initialization voltage Vint is formed substantially in parallel with the row direction, but may include a portion crossing the scan line 121.

Further, in the pixel, the driving transistor T1, the switching transistor T2, the compensation transistor T3, the initialization transistor T4, the operation control transistor T5, the light emission control transistor T6, the bypass transistor T7, the storage capacitor Cst, and the OLED are formed.

The driving transistor T1, the switching transistor T2, the compensation transistor T3, the initialization transistor T4, the operation control transistor T5, the light emission control transistor T6, and the bypass transistor T7 are formed along the semiconductor layer 131. The semiconductor layer 131 may be curved in various shapes and formed by polysilicon or oxide semiconductors. When the semiconductor layer 131 includes the oxide semiconductor, a separate passivation layer for protecting the semiconductor layer may be added.

Figure 6:
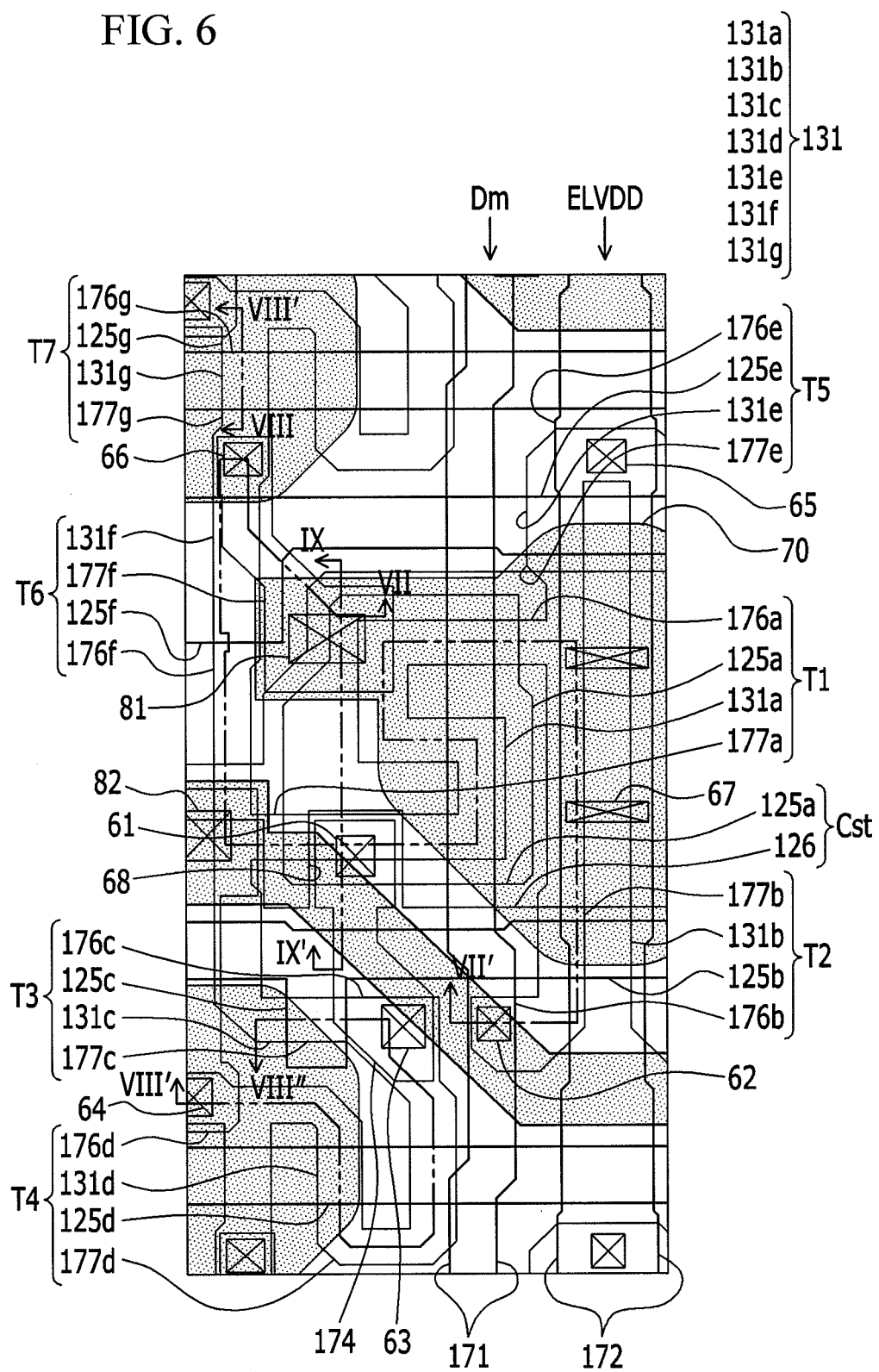
FIG. 6 is a detailed layout view of FIG. 5.
Figure 7:
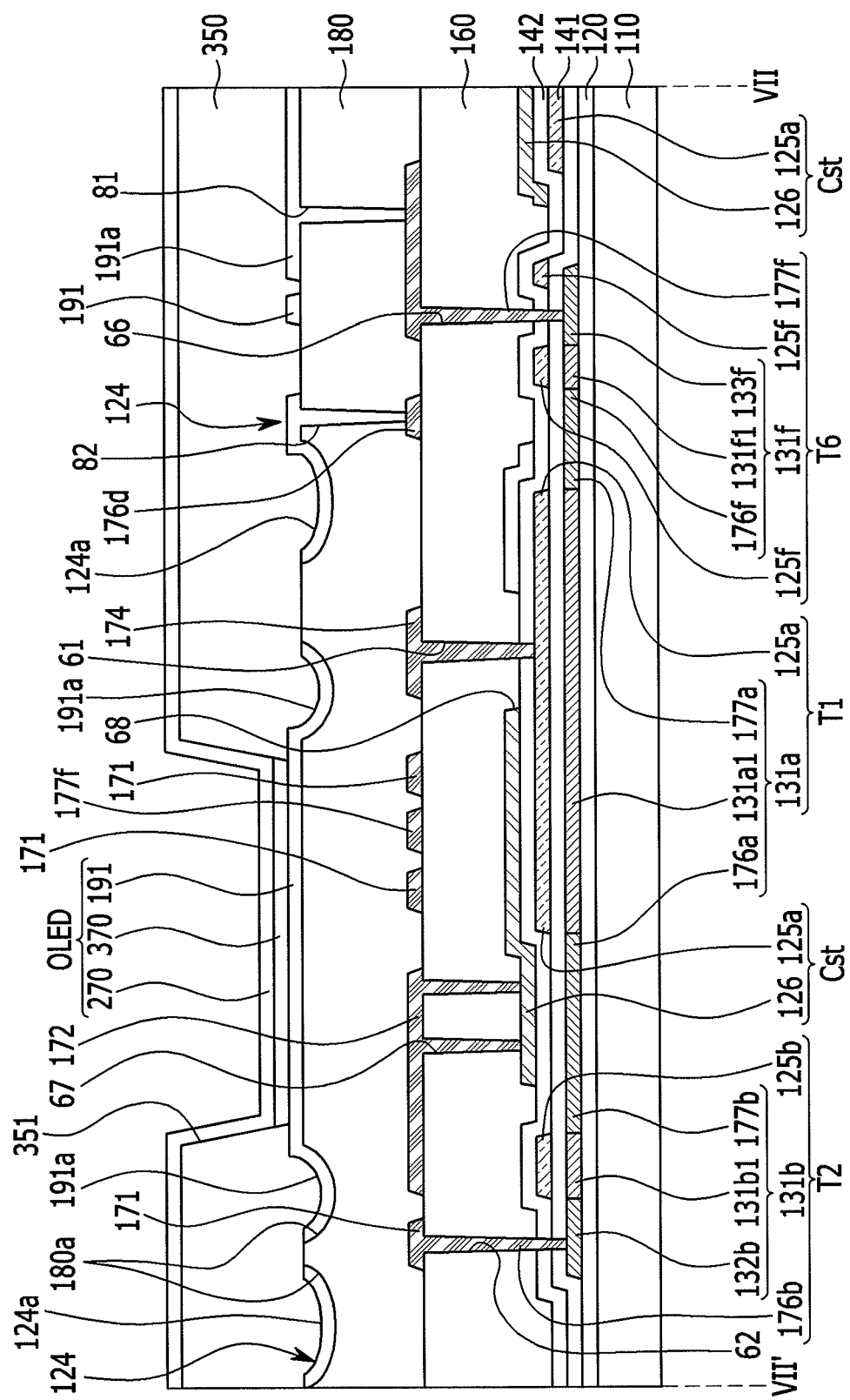
FIG. 7 is a cross-sectional view taken along line VII-VII' of FIG. 6.
Figure 8:
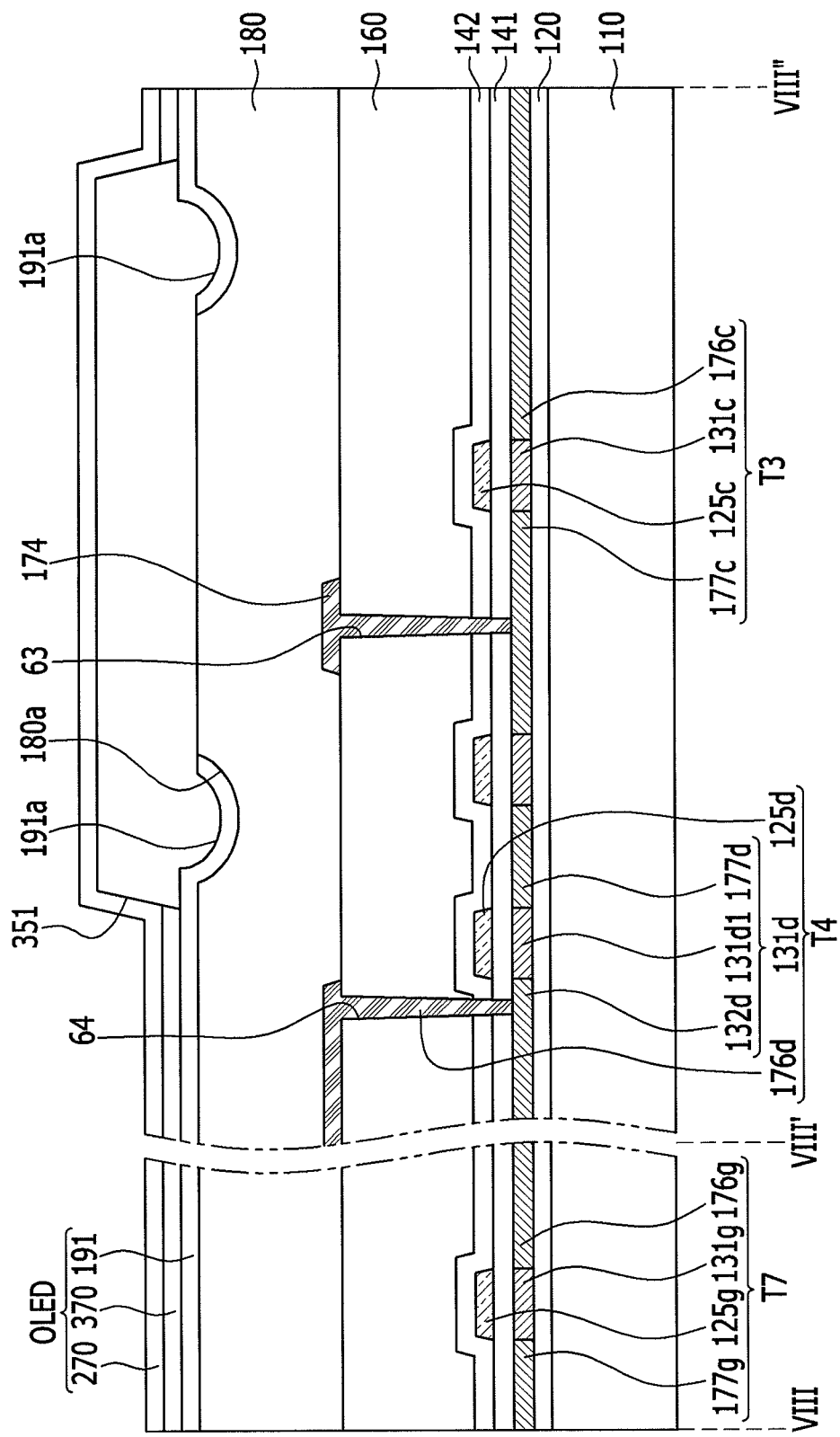
FIG. 8 is a cross-sectional view taken along lines VIII-VIII' and VIII'-VIII" of FIG. 6.
Figure 9:
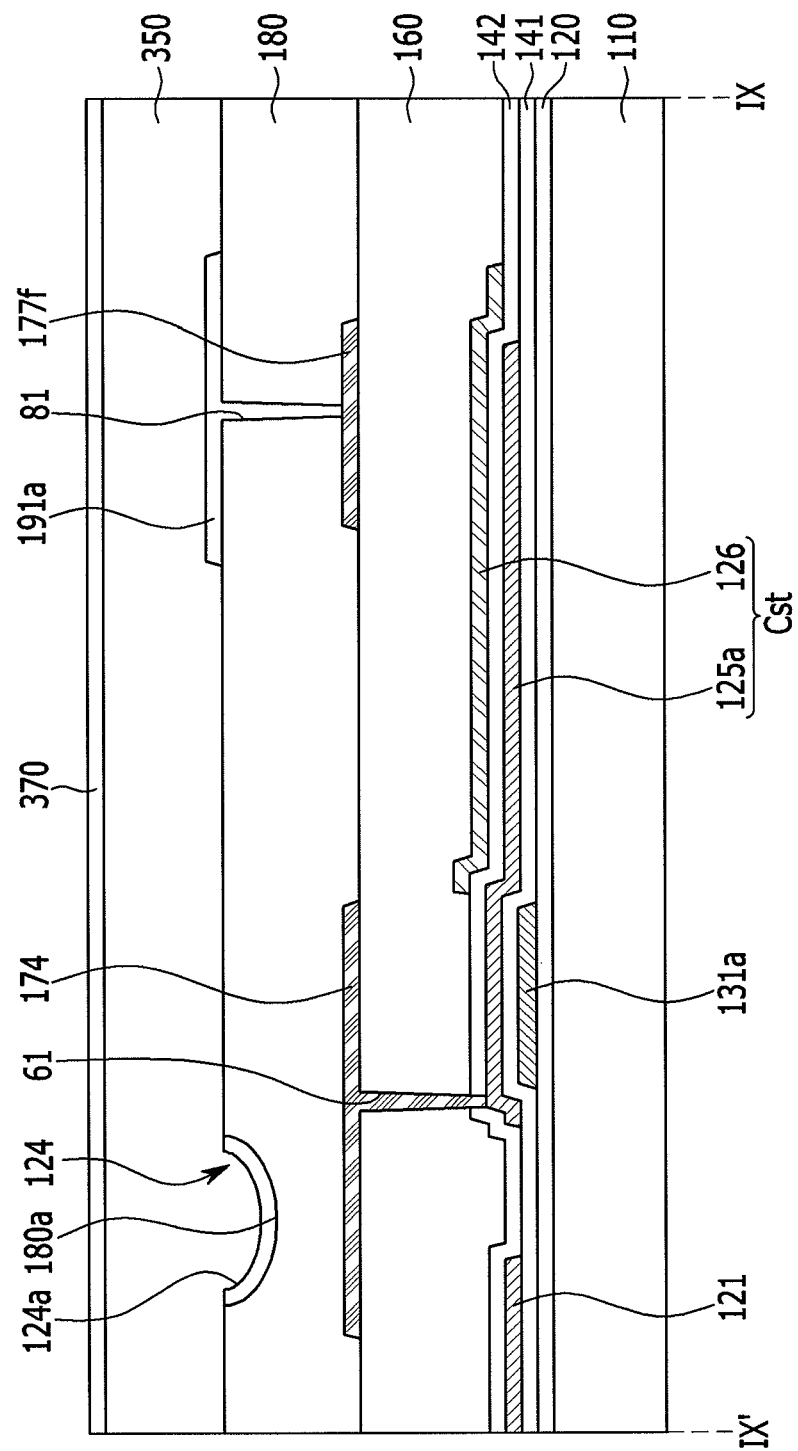
FIG. 9 is a cross-sectional view taken along line IX-IX' of FIG. 6.

FIG. 6 is a detailed layout view of FIG. 5, and FIG. 7 is a cross-sectional view taken along line VII-VII' of FIG. 6. FIG. 8 is a cross-sectional view taken along lines VIII-VIII' and VIII'-VIII" of FIG. 6, and FIG. 9 is a cross-sectional view taken along line IX-IX' of FIG. 6.

Referring to FIGS. 5 to 9, the semiconductor layer 131 includes a driving semiconductor layer 131$a$ formed in the driving transistor T1, a switching semiconductor layer 131$b$ formed in the switching transistor T2, a compensation semiconductor layer 131$c$ formed in the compensation transistor T3, an initialization semiconductor layer 131$d$ formed in the initialization transistor T4, an operation control semiconductor layer 131$e$ formed in the operation control transistor T5, a light emission control semiconductor layer 131$f$ formed in the light emission control transistor T6, and a bypass semiconductor layer 131$g$ formed in the bypass transistor T7.

The driving transistor T1 includes the driving semiconductor layer 131$a$, a driving gate electrode 125$a$, a driving source electrode 176$a$, and a driving drain electrode 177$d$. The driving semiconductor layer 131$a$ is curved and may have an oblique shape or a zigzag shape. In this case, the driving semiconductor layer 131$a$ may be elongated in a narrow space and a driving channel region 131$a$1 of the driving semiconductor layer 131$a$ has a large length to widen a driving range of the gate voltage applied to the driving gate electrode 125$a$. Accordingly, a magnitude of the gate voltage is changed to more finely control a gray scale of the light emitted from the OLED.

The driving source electrode 176$a$ and the driving drain electrode 177$a$ correspond to a driving source region 176$a$ and a driving drain region 177$a$ which are doped with impurities in the driving semiconductor layer 131$a$, respectively. For convenience, the same reference numerals are applied to the electrode and the region. The driving gate electrode 125*a* at least partially overlaps the driving semiconductor layer 131*a*, and may be formed on the same layer with the same material as the scan line 121, the previous scan line 122, the light emission control line 123, a switching gate electrode 125*b*, a compensation gate electrode 125*c*, an initialization gate electrode 125*d*, an operation control gate electrode s125*e*, and a light emission control gate electrode 125*f*.

The switching transistor T2 includes the switching semiconductor layer 131*b*, a switching gate electrode 125*b*, a switching source electrode 176*b*, and a switching drain electrode 177*b*. The switching gate electrode 125*b* is a part of the scan line 121. In a part of the data line 171, the switching source electrode 176*b* is connected with the switching source region 132*b* which is doped with an impurity in the switching semiconductor layer 131*b*, and the switching drain electrode 177*b* corresponds to the switching drain region 177*b* which is doped with an impurity in the switching semiconductor layer 131*b*.

The compensation transistor T3 includes a compensation semiconductor layer 131*c*, a compensation gate electrode 125*c*, a compensation source electrode 176*c*, and a compensation drain electrode 177*c*. The compensation source electrode 176*c* and the compensation drain electrode 177*c* correspond to the compensation source region 176*c* and the compensation drain region 177*c* which are doped with impurity in the compensation semiconductor layer 131*c*, respectively.

The initialization transistor T4 includes the initialization semiconductor layer 131*d*, an initialization gate electrode 125*d*, an initialization source electrode 176*d*, and an initialization drain electrode 177*d*. The initialization drain electrode 177*d* corresponds to the initialization drain region 177*d* which is doped with an impurity in the initialization semiconductor layer 131*d*. The initialization source electrode 176*d* is connected through a contact hole 64 with the initialization source region 132*d* which is doped with an impurity in the initialization semiconductor layer 131*d*. The initialization voltage line 124 is connected with the initialization source electrode 176*d* through a contact hole 82 and connected with the initialization semiconductor layer 131*d* through the initialization source electrode 176*d*.

The operation control transistor T5 includes the operation control semiconductor layer 131*e*, an operation control gate electrode 125*e*, an operation control source electrode 176*e*, and an operation control drain electrode 177*e*. The operation control source electrode 176*e* which is a part of the driving voltage line 172 is connected with the operation control semiconductor layer 131*e*, and the operation control drain electrode 177*e* corresponds to an operation control drain region 177*e* which is doped with an impurity in the operation control semiconductor layer 131*e*.

The light emission control transistor T6 includes the light emission control semiconductor layer 131*f*, a light emission control gate electrode 125*f*, a light emission control source electrode 176*f*, and a light emission control drain electrode 177*f*. The light emission control source electrode 176*f* corresponds to the light emission control source region 176*f* which is doped with an impurity in the light emission control semiconductor layer 131*f*, and the light emission control drain electrode 177*f* is connected with the light emission control drain region 133*f* of the light emission control semiconductor layer 131*f*.

The bypass transistor T7 includes the bypass semiconductor layer 131*g*, a bypass gate electrode 125*g*, a bypass source electrode 176*g*, and a bypass drain electrode 177*g*. The bypass source electrode 176*g* and the bypass drain electrode 177*g* correspond to a bypass source region 176*g* and a bypass drain region 177*g* which are doped with impurities in the bypass semiconductor layer 131*g*, respectively. The bypass source electrode 176*g* is directly connected with the light emission control drain region 133*f*.

One end of the driving semiconductor layer 131*a* is connected with the switching semiconductor layer 131*b* and the operation control semiconductor layer 131*e*, and the other end of the driving semiconductor layer 131*a* is connected with the compensation semiconductor layer 131*c* and the light emission control semiconductor layer 131*f*. Accordingly, the driving source electrode 176*a* is connected with the switching drain electrode 177*b* and the operation control drain electrode 177*e*, and the driving drain electrode 177*a* is connected with the compensation source electrode 176*c* and the light emission control source electrode 176*f*.

The storage capacitor Cst includes a first storage capacitor plate and a second storage capacitor plate 126 which are disposed with the second gate insulating layer 142 therebetween. The driving gate electrode 125*a* becomes the first storage capacitor plate, and the second gate insulating layer 142 becomes a dielectric material. A storage capacitance is determined by charges stored in the storage capacitor Cst and a voltage between both capacitor plates 125*a* and 126.

A connecting member 174 is substantially parallel with the data line 171 and formed on the same layer as the data line 171. The connecting member 174 is connected to the first storage capacitor plate (driving gate electrode) 125*a* at one end and connected with the compensation drain electrode 177*c* at the other end to connect the driving gate electrode 125*a* and the compensation drain electrode 177*c*. Accordingly, the storage capacitor Cst may store a storage capacitance corresponding to a difference between the driving voltage ELVDD transferred to the second storage capacitor plate 126 through the driving voltage line 172 and the gate voltage of the driving gate electrode 125*a*.

The switching transistor T2 is used as a switching element selecting a pixel to emit light. The switching gate electrode 125*b* is connected to the scan line 121, the switching source electrode 176*b* is connected to the data line 171, and the switching drain electrode 177*b* is connected with the driving transistor T1 and the operation control transistor T5. The light emission control drain electrode 177*f* of the light emission control transistor T6 is directly connected with the pixel electrode (anode) 191 of the OLED.

The connecting member 174 may be positioned with a planar distance d from the pixel electrode 191 (see FIG. 5). In this case, since the connecting member 174 does not overlap the pixel electrode 191, a parasitic capacitor between the connecting member 174 and the pixel electrode 191 is not generated.

Accordingly, since the OLED is not influenced by a voltage change of the connecting member 174, an amplitude of the driving current Id flowing in the OLED is almost not changed even in the case where a common voltage ELVSS is changed. As a result, luminance and a color of the OLED may be substantially uniformly maintained, and the common voltage ELVSS is changed by using the feature to lower power consumption.

Next, a structure in a laminated order will be described with reference to FIGS. 7 to 9. In this case, since a laminated structure of the operation control transistor T5 is almost the same as that of the light emission control transistor T6, a detailed description thereof is omitted.

The buffer layer 120 is formed on the substrate 110. In addition, on the buffer layer 120, the driving semiconductor layer 131a, the switching semiconductor layer 131b, the compensation semiconductor layer 131c, the initialization semiconductor layer 131d, the operation control semiconductor layer 131e, the light emission control semiconductor layer 131f, and the bypass semiconductor layer 131g are formed.

The driving semiconductor layer 131a includes a driving channel region 131a1, a driving source region 176a, and a driving drain region 177a. The switching semiconductor layer 131b includes a switching channel region 131b1, a switching source region 132b, and a switching drain region 177b. The compensation semiconductor layer 131c includes a compensation channel region 131c, a compensation source region 176c, and a compensation drain region 177c. For convenience, the same reference numerals are applied to the semiconductor layer and the channel region.

The initialization semiconductor layer 131d includes an initialization channel region 131d1, an initialization source region 132d, and an initialization drain region 177d. The light emission control semiconductor layer 131f includes a light emission control channel region 131f1, a light emission control source region 176f, and a light emission control drain region 133f. The bypass semiconductor layer 131g includes a bypass channel region 131g, a bypass source region 176g, and a bypass drain region 177g.

On the driving semiconductor layer 131a, the switching semiconductor layer 131b, the compensation semiconductor layer 131c, the initialization semiconductor layer 131d, the operation control semiconductor layer 131e, the light emission control semiconductor layer 131f, and the bypass semiconductor layer 131g, the first gate insulating layer 141 is formed. On the first gate insulating layer 141, a gate wire including the scan line 121, the previous scan line 122, the light emission control line 123, and the bypass control line 128 is formed.

The scan line 121 includes a switching gate electrode 125b and a compensation gate electrode 125c, and the previous scan line 122 includes an initialization gate electrode 125d. The light emission control line 123 includes an operation control gate electrode 125e and a light emission control gate electrode 125f, and the bypass control line 128 includes a driving gate electrode (first storage capacitor plate) 125a and a bypass gate electrode 125g. On the gate wire and the first gate insulating layer 141, the second gate insulating layer 142 is formed.

On the second gate insulating layer 142, the second storage capacitor plate 126 overlapping with the storage capacitor plate 125a is formed. The second storage capacitor plate 126 is wider than the first storage capacitor plate 125a to entirely cover the driving gate electrode 125a. Accordingly, the second storage capacitor plate 126 may block a voltage change of the driving gate electrode 125a from being influenced by the voltage of the pixel electrode 191 overlapping with the driving gate electrode 125a.

On the second gate insulating layer 142 and the second storage capacitor plate 126, the interlayer insulating layer 160 is formed. A data wire is formed on the interlayer insulating layer 160. The data wire includes a data line 171 including a switching source electrode 176b, a driving voltage line 172, a connecting member 174, an initialization source electrode 176d, and a light emission control drain electrode 177f.

The switching source electrode 176b is connected with the switching source region 132b through a contact hole 62 formed in the first and second gate insulating layer 141 and 142 and the interlayer insulating layer 160, and the driving voltage line 172 is connected with second storage capacitor plate 126 through a contact hole 67 formed in the interlayer insulating layer 160. The driving voltage line 172 is connected with the operation control source electrode 176e through a contact hole 65 formed in the first and second gate insulating layers 141 and 142.

One end of the connecting member 174 is connected with the driving gate electrode 125a through a contact hole 61 formed in the second gate insulating layer 142 and the interlayer insulating layer 160, and the other end of the connecting member 174 is connected with the compensation drain electrode 177c through a contact hole 63 formed in the first and second gate insulating layers 141 and 142 and the interlayer insulating layer 160. In this case, one end of the connecting member 174 is positioned in a capacitor groove 68 formed on the second storage capacitor plate 126.

The initialization source electrode 176d is connected with the initialization semiconductor layer 131d through a contact hole 64 formed in the first and second gate insulating layers 141 and 142 and the interlayer insulating layer 160. The light emission control drain electrode 177f is connected with the light emission control semiconductor layer 131f through a contact hole 66 formed in the first and second gate insulating layers 141 and 142 and the interlayer insulating layer 160.

The passivation layer 180 covering the data wire is formed on the interlayer insulating layer 160, and the pixel electrode 191 and the initialization voltage line 124 are formed on the passivation layer 180. The light emission control drain electrode 177f is connected with an extension 191b of the pixel electrode 191 through a contact hole 81 formed in the passivation layer 180, and the initialization source electrode 176d is connected with the initialization voltage line 124 through a contact hole 82 formed in the passivation layer 180.

A partition wall 350 is formed on the edge of the pixel electrode 191 and the passivation layer 180. The partition wall 350 forms an opening 351 exposing the pixel electrode 191. The passivation layer 180 and the partition wall 350 may be made of organic materials such as a polyacryl-based resin or a polyimide-based resin. The organic emission layer 370 is formed on the pixel electrode 191 exposed by the opening 351, and the common electrode 270 is formed on the organic emission layer 370.

A red organic emission layer, a green organic emission layer, and a blue organic emission layer may be formed in a red pixel R, a green pixel G, and a blue pixel B illustrated in FIG. 4, respectively. On the other hand, the red organic emission layer, the green organic emission layer, and the blue organic emission layer are laminated on all of the red pixel R, the green pixel G, and the blue pixel B, and a red filter, a green filter, and a blue filter may be formed in the red pixel R, the green pixel G, and the blue pixel B, respectively.

On the other hand, white organic emission layers are laminated on all of the red pixel R, the green pixel G, and the blue pixel B, and a red filter, a green filter, and a blue filter may be formed in the red pixel R, the green pixel G, and the blue pixel B, respectively. For example, the white organic emission layers may include a yellow organic emission layer and a blue organic emission layer, include a cyan organic emission layer and a red organic emission layer, or include a magenta organic emission layer and a green organic emission layer.

An encapsulation member (not illustrated) sealing the OLED is formed on the common electrode 270. The encapsulation member may be sealed on the substrate 110 by a sealant or configured by a thin film encapsulation formed by laminating an inorganic film and an organic film on the common electrode 270.

In FIG. 4, the red pixel R, the green pixel G, and the blue pixel B may have the same shape as the pixel electrode 191 of the corresponding pixel. That is, hereinabove, the planar shape of the pixel electrode 191 is assumed as the shape of the corresponding pixel. The pixel electrode 191 includes an edge which is formed to be larger than the organic emission layer 370 and does not overlap with the organic emission layer 370, and includes an extension 191b overlapping with a contact hole 81. The initialization voltage line 124 may be positioned between the pixels in the second row 2N and the pixels in the third row 3N and formed by a repeated curved pattern.

The pixel electrode 191 includes a first curved portion 191a which is concavely or convexly formed in a region which does not overlap with the organic emission layer 370, that is, an edge of the pixel electrode 191. The first curved portion 191a does not directly reflect light (external light) incident from the environment but scatters the light to minimize the reflection of the external light. The initialization voltage line 124 also includes a second curved portion 124a formed concavely or convexly toward the common electrode 270 to scatter the external light. In this case, the initialization voltage line 124 may include a second curved portion 124a formed at the remaining portion except for the portion overlapping with the contact hole 82.

In FIGS. 7 to 9, the case where the surface of the passivation layer 180 includes the concave portions 180a and the first curved portion 191a and the second curved portion 124a are concavely formed is illustrated as an example. Meanwhile, the surface of the passivation layer 180 may include a plurality of convex portions, and the first curved portion and the second curved portion may be convexly formed.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
   a substrate;
   a plurality of transistors over the substrate;
   a passivation layer covering the transistors; and
   an OLED over the passivation layer and including a pixel electrode, an organic emission layer, and a common electrode,
   wherein the pixel electrode includes a first curved portion that does not overlap the organic emission layer in the direction of light emission.

2. The OLED display of claim 1, wherein the pixel electrode includes a metal reflective film, and wherein the common electrode includes at least one of a transparent conductive film and a translucent conductive film.

3. The OLED display of claim 2, further comprising:
   an initialization voltage line over the passivation layer and of the same material as the pixel electrode,
   wherein the initialization voltage line includes a second curved portion.

4. The OLED display of claim 3, wherein the first and second curved portions have substantially the same shape.

5. The OLED display of claim 3, wherein the first and second curved portions have substantially the same size.

6. The OLED display of claim 3, wherein the first and second curved portions do not directly contact each other.

7. The OLED display of claim 3, wherein the second curved portions is not directly above the transistors.

8. The OLED display of claim 3, wherein the first and second curved portions are concave toward the common electrode.

9. The OLED display of claim 8, wherein the surface of the passivation layer includes a plurality of concave portions, and wherein the first and second curved portions are over the concave portions with predetermined thicknesses.

10. The OLED display of claim 3, wherein the first and second curved portions are convex toward the common electrode.

11. The OLED display of claim 10, wherein the surface of the passivation layer includes a plurality of convex portions, and wherein the first and second curved portions are over the convex portions with predetermined thicknesses.

12. The OLED display of claim 3, wherein the second curved portion is at the remaining portion except for the portion overlapping the contact hole of the initialization voltage line.

13. The OLED display of claim 1, wherein the first curved portion is not directly below the organic emission layer.

14. The OLED display of claim 1, wherein each of the transistors includes source and drain electrodes, wherein the pixel electrode includes a non-linear portion that contacts one of the source and drain electrodes, and wherein the height of the first curved portion is similar to that of the non-linear portion.

15. The OLED display of claim 1, wherein the passivation layer has a groove or protrusion on which the first curved portion is located.

16. An organic light emitting diode (OLED) display, comprising:
   a substrate;
   a plurality of transistors over the substrate;
   a passivation layer covering the transistors; and
   a plurality of OLEDs over the passivation layer, wherein each of the OLEDs includes a pixel electrode, an organic emission layer, and a common electrode,
   wherein the pixel electrode includes at least one first curved portion that is convex or concave with respect to the common electrode, and wherein the first curved portion is between adjacent organic emission layers, and wherein the first curved portion is not directly above any of the transistors.

17. The OLED display of claim 16, wherein the first curved portion does not overlap the organic emission layer in the depth dimension of the OLED display.

18. The OLED display of claim 16, further comprising an initialization voltage line over the passivation layer, wherein the initialization voltage line includes at least one second curved portion that is convex or concave with respect to the common electrode.

19. The OLED display of claim 16, wherein the passivation layer has a groove or protrusion on which the first curved portion is located.

* * * * *